(12) United States Patent
Kamm et al.

(10) Patent No.: US 7,489,386 B2
(45) Date of Patent: Feb. 10, 2009

(54) SYSTEM AND METHOD FOR PROJECTING A PATTERN FROM A MASK ONTO A SUBSTRATE

(75) Inventors: Frank-Michael Kamm, Dresden (DE); Rainer Pforr, Weixdorf (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/743,870

(22) Filed: May 3, 2007

(65) Prior Publication Data
US 2007/0263198 A1 Nov. 15, 2007

(30) Foreign Application Priority Data
May 12, 2006 (DE) ........................ 10 2006 022 352

(51) Int. Cl.
G03B 27/54 (2006.01)
G03B 27/52 (2006.01)

(52) U.S. Cl. .......................................... 355/67; 355/55

(58) Field of Classification Search .................. 355/52, 355/53, 55, 67; 430/5, 20, 30; 250/548
See application file for complete search history.

(56) References Cited

U.S. PATENT DOCUMENTS

| | | | |
|---|---|---|---|
| 5,962,174 A * | 10/1999 | Pierrat | 430/5 |
| 6,610,447 B2 * | 8/2003 | Yan et al. | 430/5 |
| 6,835,508 B2 | 12/2004 | Butschke et al. | |
| 7,362,414 B2 * | 4/2008 | Singer et al. | 355/30 |
| 2005/0140957 A1 | 6/2005 | Luijkx et al. | |
| 2006/0091324 A1 | 5/2006 | Dierichs | |
| 2006/0092397 A1 | 5/2006 | Laan et al. | |

* cited by examiner

*Primary Examiner*—Hung Henry Nguyen
(74) *Attorney, Agent, or Firm*—Edell, Shapiro & Finnan, LLC

(57) ABSTRACT

A system for projecting a pattern from a mask onto a substrate comprises a radiation source for emitting a light beam in the extreme ultraviolet wavelength range, a mask including absorbent and reflective structures forming the pattern, a collector mirror and an illumination optical system forming a first part of a beam path in order to direct the light beam onto the mask to produce a patterned light beam, a projection optical system including an arrangement of reflective mirrors forming a second part of the beam path in order to focus the reflected light beam from the mask onto the substrate, and an optical element arranged in the beam path and including at least two regions having different degrees of reflection or transmission. First and second of the regions are assigned to respective different first and second positions on the mask and/or collector mirror in accordance with the beam path.

26 Claims, 3 Drawing Sheets

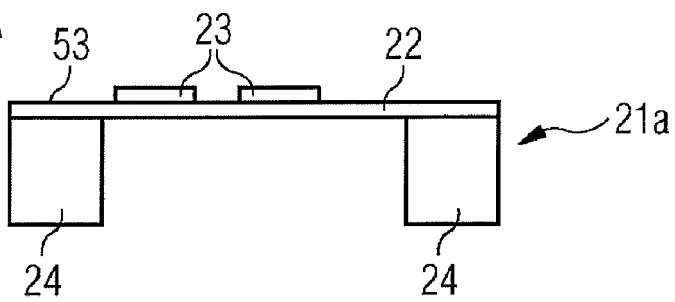
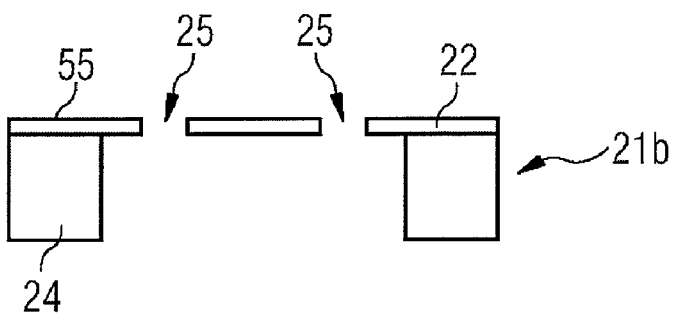
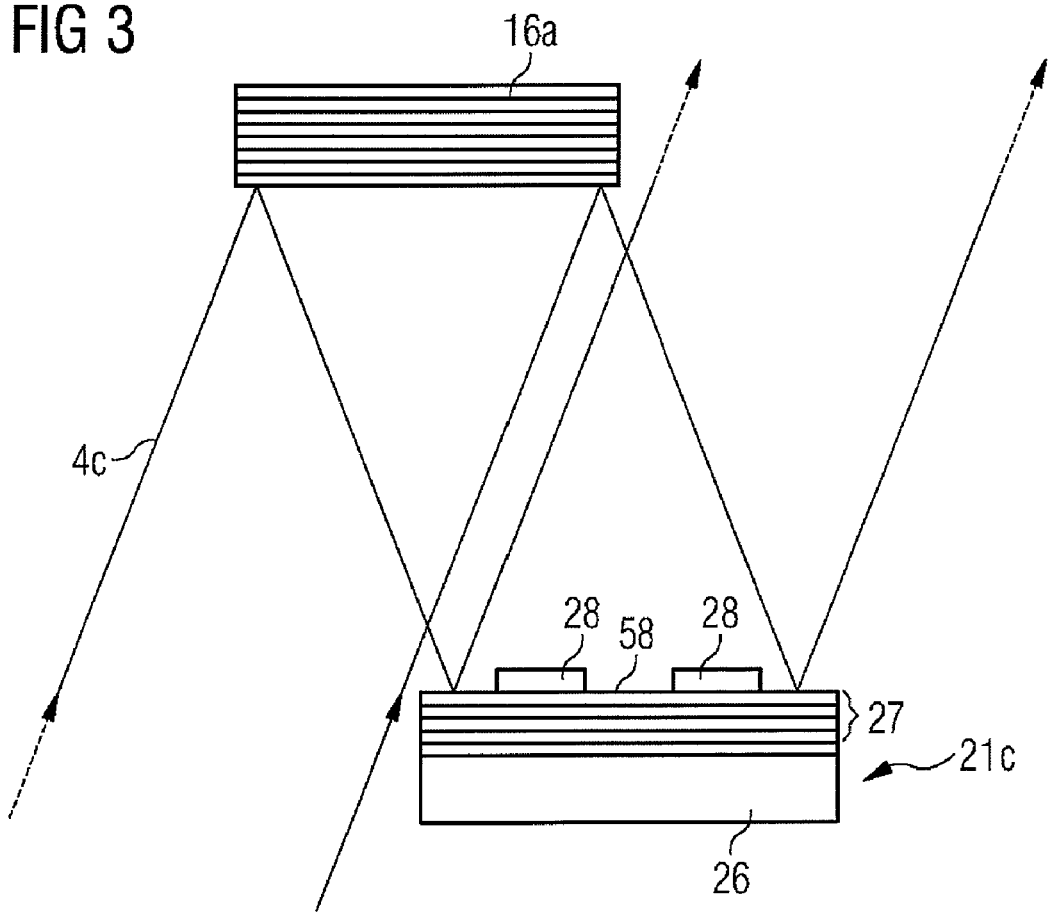

SYSTEM AND METHOD FOR PROJECTING A PATTERN FROM A MASK ONTO A SUBSTRATE

CROSS REFERENCE TO RELATED APPLICATIONS

This application claims priority under 35 U.S.C. § 119 to German Patent Application No. DE 102006022352.7 filed on May 12, 2006, entitled "Arrangement and Method for the Projection of a Pattern from a Mask onto a Substrate," the entire contents of which are hereby incorporated by reference.

BACKGROUND

On account of the progressive reduction of the feature sizes to be formed in semiconductor fabrication, a transition to so-called EUV lithography (EUV: extreme ultraviolet) should be expected in the near future, starting at a feature size of approximately 40 nm or less. EUV lithography makes use of light or radiation having wavelengths in the range of 11 to 14 nm in order to transfer the patterns formed beforehand on masks (EUV masks) onto a substrate (e.g., a semiconductor wafer). The EUV radiation is also referred to as soft X-ray radiation.

Besides the requisite conversion of the resist process, this transition from optical projection lithography used at the present time (deep ultraviolet DUV, 284 nm or 193 nm; far ultraviolet FUV, 157 nm) has the consequence that, owing to the nontransparency of lens systems of conventional materials with respect to the EUV radiation, only mirrors or reflection optical systems can be used in the corresponding exposure devices. Therefore, the beam paths of such devices change considerably. Furthermore, reflection masks should preferably be used in this technology since the conventional quartz masks as transmission masks are also nontransparent with respect to the EUV radiation.

The progressive development furthermore consists in providing materials for the components, such as mirrors, masks, etc., which exhibit no or only insignificant degradation with respect to the high-energy EUV radiation. As long as these degradations have a homogeneous effect over the image field in the case of the mirror components, a reduction of the degree of reflection (the reduction being caused for instance by removal on account of the source particles at the mirror surface) can be compensated for in the simple case by a higher intensity of the radiation source, for example, if the scattering effects that possibly accompany this as a result of the degraded mirror surface can be disregarded here.

Degradations may occur in an inhomogeneous manner, however, precisely at the mirror arranged closest to the radiation source, namely the collector mirror. On the one hand, the local radiation intensity is strongest here and, on the other hand, the collector mirror, since it has to couple out the radiation in a specific direction (e.g., as a parabolic mirror) has a form which necessitates different distances between its mirror surface and the radiation source. As a result, different positions at the mirror surface degrade to different extents, under certain circumstances.

The position of the collector in the beam path of the EUV exposure device is essentially conjugate with respect to the position of the mask. Consequently, inhomogeneities in the degree of reflection of the collector mirror also lead to a nonuniform illumination of the image field of the mask. Fluctuations of the line widths of structure elements that are imaged onto the substrate and are processed there in the resist may be the consequence.

Other components, in particular mirrors in the beam path, may be detrimentally affected and degrade over time, such that an inhomogeneous image field distribution may be the consequence. Previous solutions provide for cost-intensively exchanging the corresponding components upon establishing the cause (i.e., the degradation).

Fluctuations of the line widths on the substrate may also be caused, however, by variations of the widths of the corresponding lines or structure elements on the EUV mask which are present from the outset or arise only in the course of time and of the hard production conditions in the EUV exposure device.

In the case of the EUV masks, besides new production, it would also be possible to perform locally limited repairs on the mask. Large-area applications are ruled out here, however. Moreover, in the case of repair, it is necessary to consider the loss of time for returning the mask to the manufacturer and the suddenly occurring reconfiguration with a subsequent product for the exposure device if the degradation is ascertained only on the end product.

Therefore, there is a need to reduce the influence of degradations of the components in the EUV exposure device on the quality of the exposure process and furthermore to reduce the costs for maintaining quality in semiconductor fabrication via EUV lithography.

SUMMARY

A system and method for the projection of a pattern from a mask, in particular a EUV mask, onto a substrate are described herein. The system comprises: a radiation source for emitting a light beam in the extreme ultraviolet wavelength range, a mask comprising absorbent and reflective structure elements arranged in a pattern, a collector mirror and an illumination optical system forming a first part of a beam path in order to direct the light beam onto the mask such that a patterned light beam is reflected, a projection optical system comprising an arrangement of reflective mirrors forming a second part of the beam path in order to focus the light beam reflected from the mask onto the substrate, and an optical element including at least two regions having different degrees of reflection or transmission and arranged in the beam path such that a first region is assigned to a first position on the mask and/or on the collector mirror and a second region is assigned to a second different position on the mask and/or on the collector mirror.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The system and method will now be explained in more detail on the basis of exemplary embodiments with the aid of drawings, where:

FIGS. 2a and 2b show transmissive optical elements in accordance with second exemplary embodiments;

FIG. 3 shows a reflective optical element in accordance with a third exemplary embodiment;

DETAILED DESCRIPTION

Embodiments of methods and systems for the projection of a pattern from a mask onto a substrate are discussed in detail below. It is appreciated, however, that the present invention provides many applicable inventive concepts that can be embodied in a wide variety of specific contexts. The specific embodiments discussed are merely illustrative and do not limit the scope of the invention.

Figure 1:
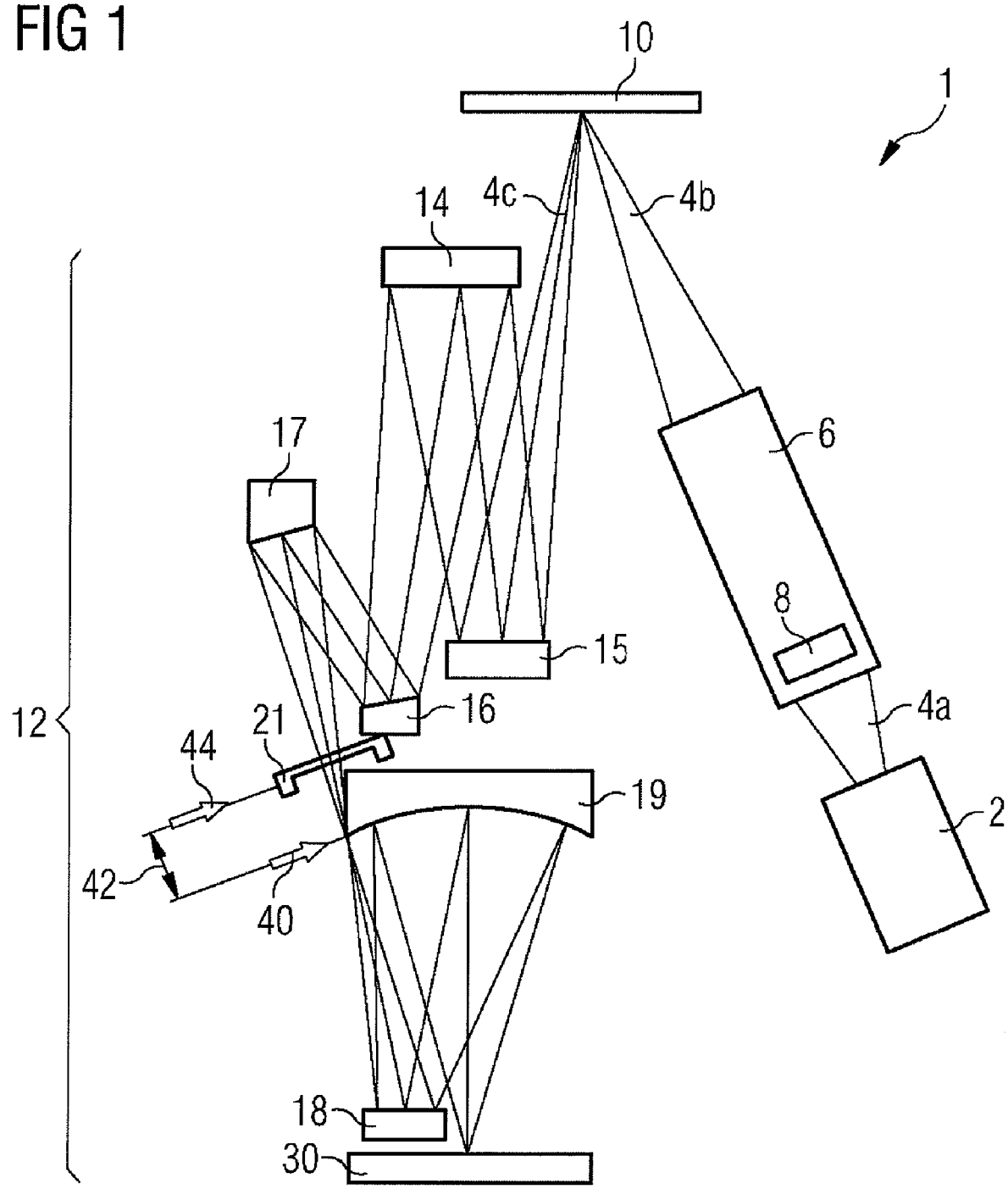
FIG. 1 shows a first exemplary embodiment of a system for the projection of a pattern from a EUV mask onto a substrate.

FIG. 1 shows a system or apparatus 1 for the projection of a pattern from a EUV mask onto a substrate in accordance with a first exemplary embodiment. A radiation source 2 generates a light beam 4a, typically having a wavelength of approximately 13.5 nm (extreme ultraviolet wavelength range, EUV) and preferably in the range of 1 nm to 14 nm. An illumination optical system 6 comprises a number of mirrors, including a collector mirror 8, which is illustrated only schematically in FIG. 1.

The light beam (reference symbol 4b) is directed onto a EUV reflection mask 10 by the illumination optical system 6. A pattern of absorbent and reflective structure elements is formed on the mask in accordance with a predetermined layout. The pattern is intended to be transferred to a substrate (e.g., a semiconductor wafer 30). The reflection mask typically comprises a substrate, on which a layer stack is applied, which layer stack reflects incident light beams. By way of example, a covering layer (capping layer) protecting the layer stack and also a buffer layer are applied on the layer stack and are established in production-dictated fashion. Furthermore, an absorber layer is situated on the layer stack. Absorbent structure elements in accordance with the pattern to be transferred correspond to regions in the absorber layer which were not removed, while the reflective layer stack is uncovered precisely in removed regions. The buffer layer is likewise removed in this case, whereas the protective covering layer remains.

The light beam 4c reflected by the mask is therefore patterned via the pattern on the mask. It passes further through an arrangement of mirrors 14-19, which together form the projection optical system 12. Via the latter, the light beam 4c is finally imaged (i.e., focused) onto the substrate 30.

An optical element 21 is arranged within the beam path formed by the light beam 4a-c. In FIGS. 2a-2b, an optical element used in transmissive fashion is involved (i.e., the light beam 4c in this case passes through the respective optical elements 21a, 21b).

The optical element is arranged at a position 44 in the beam path at which it is situated at only a small defocus 42 from a conjugate plane 40 with respect to the plane of the mask in the beam path of the system 1. The defocus 42 is less than 10 mm, for example, in the case of a transparent optical element as shown here.

The optical element may also be situated in one of the conjugate planes 40 with respect to the mask. In this case, however, boundaries between the regions of different reflection or transmission which are formed on the optical element could be imaged directly in the resist on the substrate 30. Therefore, a defocus value of greater than zero may be chosen since high resolutions for the regions on the optical element are not necessarily intended to be obtained here.

However, since the optical element 21 is arranged close to the conjugate plane, in order to be precise both with respect to the mask 10 and with respect to the collector mirror 8, positions on these unambiguously correspond to the individual regions on the optical element. This would not be the case, if, for instance, the optical element 21 were arranged close to a Fourier-transformed plane with respect to the mask.

As a result, it is possible, in a targeted manner, for structure elements on the EUV mask 10 having line widths that are locally too small relative to an ideal value to be amplified in terms of their intensity during imaging, or conversely for those having excessively large line widths to be attenuated.

Moreover, it is possible to compensate for local degradations on the collector mirror which lead to reduced reflection there.

The radiation source, the illumination optical system and the projection optical system are constituent parts of a EUV exposure device. The EUV mask is typically introduced into a mount arranged at a conjugate plane with respect to the collector mirror and with respect to the substrate plane. The optical element is situated at a slight distance outside one of the conjugate planes with respect to the mask in the beam path (e.g., directly in the vicinity of the mask) in the region of the illumination optical system or in the region of the projection optical system.

The distance between the optical element and the EUV mask or a conjugate plane with respect to the two is, for example, between 1 and 10 mm if the optical element is transmissive. If it is used in reflective fashion, then larger distances of 20 cm through 1 m may also be necessary due to requirements of construction. The optical element consequently lies in a defocus position in the context of imaging. As a result, it becomes possible (despite discrete absorbent elements on the optical element having a defined degree of reflection or transmission on account of the "unsharp" imaging) to achieve a blurring of the elements, with the result that any degree of reflection or transmission can be achieved solely by a density distribution of the absorbent elements.

The optical element consequently has different regions characterized by a different degree of reflection when the optical element is operated as a mirror, or a different degree of transmission if radiation passes through it during exposure. The regions may also be part of a continuous distribution of degrees of reflection or transmission from the mask.

On account of the arrangement in the beam path of the exposure device, and since the optical element is positioned close to a conjugate plane with respect to the mask and/or collector mirror, the regions are in each case assigned to positions on the mask and/or the collector mirror. Consequently, the radiation fluxes from the corresponding positions on the mask and/or the collector mirror are subsequently attenuated in an individual manner by the regions of the optical element.

Thus, in order, for example, to counteract an intensified degradation in outer or inner regions of the collector mirror, it is possible, in the regions of the optical element which correspond to these positions, to establish an increased reflectivity or transmissivity in contrast to other regions of the optical element, thereby precisely compensating for the degradation.

In this way, it is not necessary to exchange the collector mirror. Rather, an optical element that compensates for the degradation can be introduced into the beam path.

In the case of fluctuations of the line width on the mask, the positions or zones having an increased line width can be assigned such regions on the optical element which have a reduced reflection or transmission, with the result that compensation occurs here.

In order to produce such an optical element, according to one embodiment, a substrate (wafer) is preferably exposed first in the absence of an optical element. The structure elements of the imaged pattern are measured in order to determine line width variations. Deviations from predetermined ideal values are determined, in which case the ideal values may originate from the abstract layout or represent, for example, an average value of the exposed substrate.

On the basis of a relationship between a locally obtained line width and the dose radiated in, it is then possible to deduce how the dose must be altered such that a target line width is achieved. The value of the dose is compared with the dose used originally. This reveals the local attenuation which can be applied for this position. It is then possible to produce an optical element which has a degree of reflection or transmission which corresponds to the attenuation in the relevant region.

From a distribution of the line width variations over the mask, it is consequently possible to calculate a reflection or transmission distribution, depending on whether a reflective or transmissive optical element is present.

FIGS. 2a-2b show further exemplary embodiments of the present invention. In the transmissive embodiment shown, the optical element 21a (FIG. 2a) may have a frame 24, above which a membrane 22 is arranged. The membrane may be formed from silicon, which is resistant to the radiation. The thickness is less than 200 nm, for example. The degree of transmission of the membrane may be, for example, greater than or equal to 60%, and optionally greater than or equal to 65%. At a wavelength of approximately 13.5 nm, the membrane 22 is then, for example, approximately 70% transmissive (i.e., degree of transmission).

In addition, the membrane 22 has been locally modified in regions 23, 25 relative to surrounding regions 53 and 55, respectively. In the case of the optical element 21a in FIG. 2a, carbon has been deposited locally for this purpose (e.g., in regions 23 (schematic illustration in the figures)). This is done, for example, by so-called contamination lithography, in which an electron beam is used to deposit carbon from a vapor phase onto the surface of the membrane in the desired regions in a targeted manner.

As an alternative, it is also possible to carry out a local oxidation of the silicon of the membrane. It is crucial for absorbent elements to be formed by the additional layer. The degree of transmission can be set here either by the layer thickness (in a vertical direction) or by the density of absorbent elements lying close together. As described above, the images of the absorbent elements are blurred on account of the defocus distance.

FIG. 2b shows an alternative embodiment of an optical element 21b, in which, instead of the deposition or formation of an additional layer on the membrane, holes are formed in the regions 25. The holes are transparent as intended. In this case, different degrees of transmission can be achieved by the arrangement or distribution of holes having a minimal diameter. The transmission then scales with the density of the holes.

FIG. 3 shows an exemplary embodiment of an optical element 21c, which is a reflective element comprising a multilayer mirror. It is integrated into the beam path of the light beam 4c in a manner similar to that shown in FIG. 1, but in such a way that reflection is provided instead of transmission. The reference symbol of the corresponding mirror 16a (e.g., replacing mirror 16 with mirror 16a in this example) indicates the position in the beam path in the region of the projection optical system 12.

Figure 5:
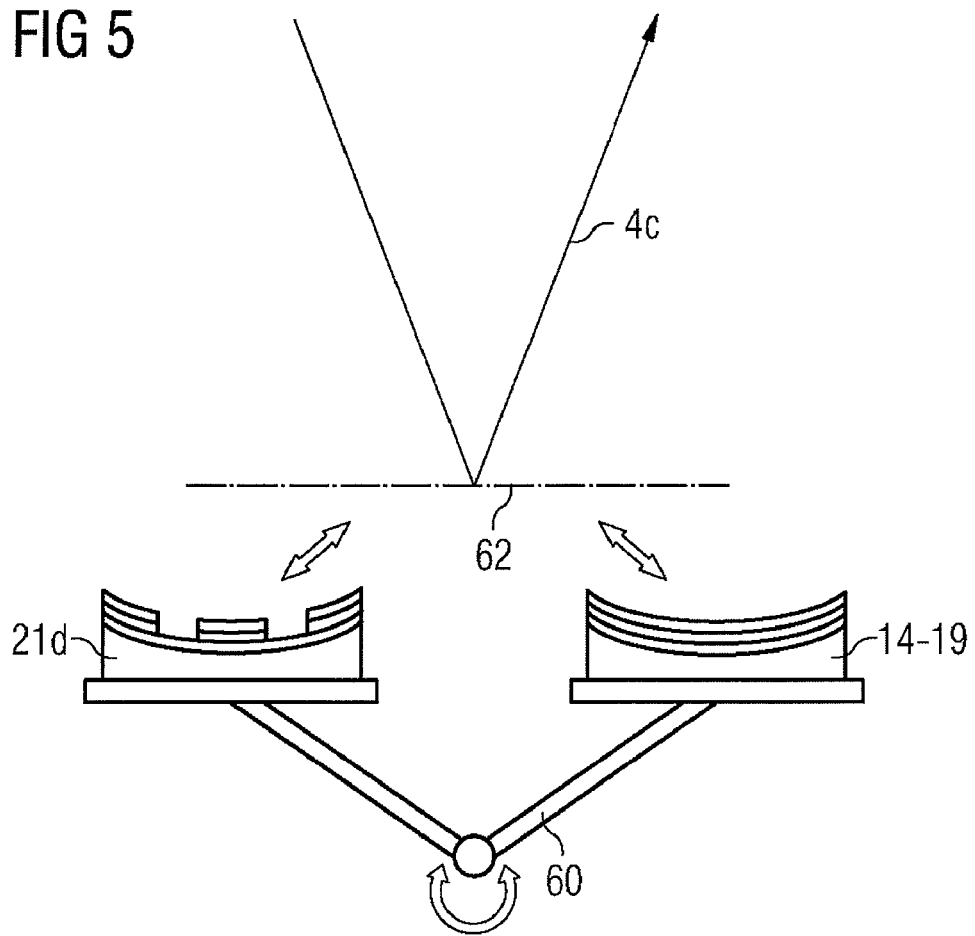
FIG. 5 shows an exemplary embodiment with a turntable for the selection between an optical element that effects correction according to the present invention and a conventional mirror.

In order to enable the selection between correction elements and an unimpaired beam path, a turntable/turret may be provided, which moves either the reflective optical element or a corresponding standard mirror into the beam path. One example is shown in FIG. 5.

A first variant provides for embodying the optical reflective element with a planar, even surface. Since corresponding mirrors are not provided in beam paths of already implemented EUV exposure devices, adaptations would also have to be performed in this respect.

A second variant provides for producing a correspondingly shaped optical reflective element with respect to a mirror in the conventional beam path that performs a specific function. The optical element then fulfills both the desired correction function and the focusing property in the assembly of the beam path in the exposure device. The example shown in FIG. 5 corresponds to this variant, where the surfaces of mirrors 14-19 and optical element 21d are equally shaped or curved in order to fulfill this function. The turntable 60 enables the selection in order to move the desired mirror to the predetermined mirror position 62 in the beam path 4c.

In accordance with FIG. 3, a multilayer 27 comprising, for example, an alternate sequence of layers of molybdenum and silicon is arranged on the substrate 26 of the optical element 21c. As in the case of a reflection mask 10, absorbent elements are provided on the surface in regions 28 having a low reflection in comparison with other regions 58, on which absorbent layers were not deposited. Production proceeds, for example, analogously to that of conventional reflection masks. Buffer layers and/or covering or capping (e.g., silicon, ruthenium, etc.) layers may therefore also be provided. The absorbent elements make it possible to set a desired degree of reflection in the regions 28. The statements made for FIGS. 2a, 2b with regard to the density distribution of small absorbent elements are applicable here.

Figure 4:
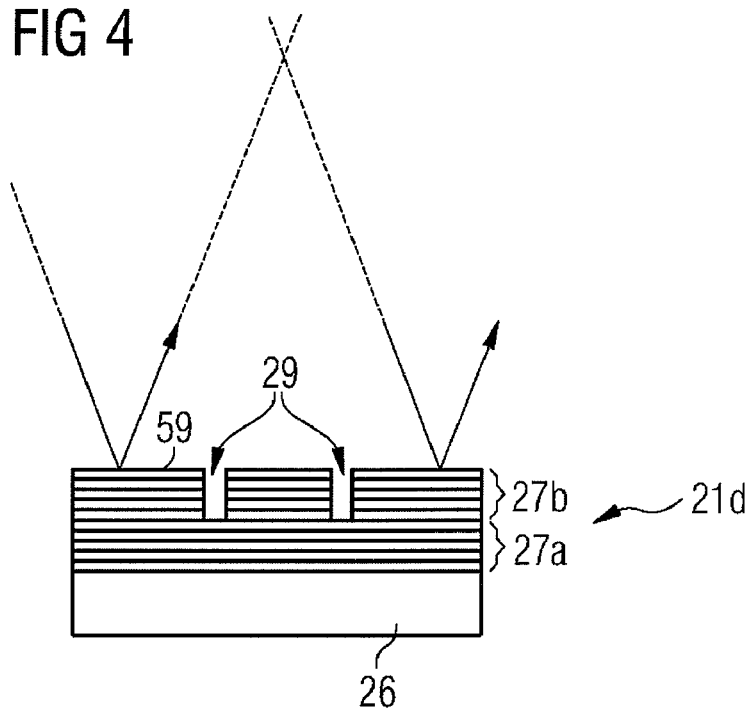
FIG. 4 shows a reflective optical element in accordance with a fourth exemplary embodiment.

An alternative embodiment is shown in FIG. 4. In this case, the reflective optical element 21d is thinned or even removed (e.g., via local etching) with regard to its covering layers 27b within the multilayers in regions 29, with the result that the reflection behavior changes here. On account of this, it is possible to set the desired degree of reflection. By contrast, upper covering layers are not thinned or removed in the regions 59.

The above described technique can also be repeated iteratively. In other words, a projection is carried out anew, but with the optical element. The line width variations are measured again, which reveals a changed, adapted distribution of the reflections or transmissions across the surface of the optical element.

The optical element may be embodied as a transmission or reflection element. The membrane mask may be involved in the first case. The membrane is semitransparent with respect to the EUV radiation. Different degrees of transmission can be effected either by forming holes in the thin membrane or by local application of absorbent layers or structure elements.

In the second case, the optical element may be formed in a manner similar to a mirror of the exposure device or the reflection mask itself. Degrees of reflection can be realized here, for example, by application of absorbent layers or structure elements or by altering the covering layer of the mirror, for instance if a multilayer mirror is involved.

The system may further include movable mounts for loading, unloading or aligning at least one of the mask, the substrate and the optical element.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A system for projecting a pattern from a mask onto a substrate comprising:
   a radiation source to emit a light beam in the extreme ultraviolet wavelength range;
   a mask to reflect a patterned light beam and comprising absorbent and reflective structure elements arranged to form the pattern;
   a collector mirror and an illumination optical system forming a first part of a beam path to direct the light beam onto the mask;
   a projection optical system comprising an arrangement of reflective mirrors forming a second part of the beam path to focus the patterned light beam from the mask onto a substrate and image the pattern on the substrate; and
   an optical element arranged in the beam path and located a distance from any conjugate plane associated with the mask, the optical element comprising at least two regions having different degrees of reflection or transmission, wherein a first region is assigned to a first position on at least one of the mask and the collector mirror and a second region is assigned to a second different position on at least one of the mask and the collector mirror in accordance with the beam path.

2. The system according to claim 1, wherein the degree of reflection or transmission in the first and second regions is configured to compensate for a deviation of a width of the reflective structure elements of the pattern from a predetermined ideal value at the respective assigned positions on the mask.

3. The system according to claim 1, wherein the degree of reflection or transmission in the first and second regions is configured to compensate for a deviation of the degree of reflection from a predetermined ideal value at the respectively assigned different positions on the collector mirror, and wherein said deviation is caused by radiation removal.

4. The system according to claim 1, wherein the optical element is a reflection element.

5. The system according to claim 4, wherein the optical element comprises a multilayer mirror.

6. The system according to claim 5, wherein the multilayer mirror is coated with an absorbent material in at least one of the first and second regions to produce the different degree of reflection.

7. The system according to claim 5, wherein the multilayer mirror comprises at least one upper covering layer that is thinned or removed via local etching in the first or second regions to produce the different degree of reflection.

8. The system according to claim 5, wherein the multilayer mirror further comprises a capping layer for protecting a reflective surface of the multilayer mirror, and wherein the capping layer includes silicon or ruthenium.

9. The system according to claim 5, wherein the multilayer mirror comprises an alternate sequence of layers of molybdenum and silicon.

10. The system according to claim 1, wherein the optical element is a transmissive element.

11. The system according to claim 10, wherein the transmissive element includes a membrane mask.

12. The system according to claim 11, wherein the membrane mask comprises a membrane including silicon.

13. The system according to claim 11, wherein the membrane mask comprises a membrane through which the light beam radiates in the beam path, and wherein the membrane includes a thickness of 200 nm or less.

14. The system according to claim 13, wherein the degree of transmission of the membrane is greater than or equal to 60%.

15. The system according to claim 13, wherein the degree of transmission of the membrane is greater than or equal to 65%.

16. The system according to claim 11, wherein an absorbent layer is disposed in the first or second regions on the membrane mask to produce a reduced degree of transmission.

17. The system according to claim 16, wherein the absorbent layer comprises carbon.

18. The system according to claim 16, wherein the absorbent layer comprises an oxide.

19. The system according to claim 11, wherein the membrane mask comprises holes in the first or second regions to produce an increased degree of transmission.

20. The system according to claim 1, wherein the radiation source emits light in a wavelength range of 11 nm to 14 nm.

21. The system according to claim 1, further comprising:
   movable mounts for loading, unloading or aligning at least one of the mask, the substrate and the optical element.

22. The system according to claim 1, further comprising:
   a movable turntable for mounting the optical element thereto, wherein the turntable is operable to move the optical element into or out of the beam path.

23. The system according to claim 22, wherein the optical element is a reflective optical element and comprises an uneven, curved surface for focusing the light-beam in the beam path.

24. A method for projecting a pattern from a mask onto a substrate comprising:
   emitting a light beam in the extreme ultraviolet wavelength range via a radiation source;
   directing the light beam onto a mask via an illumination optical system including a collector mirror and forming a first part of a beam path, wherein the mask includes absorbent and reflective structure elements arranged to form the pattern;
   patterning and reflecting the light beam from the mask;
   focusing the reflected light beam on the substrate to image the pattern on the substrate via a projection optical system including an arrangement of reflective mirrors forming a second part of the beam path; and
   compensating for a deviation of a width of reflective structure elements of the pattern at first and second positions on the mask from a predetermined ideal value by attenuating an intensity of the light beam reflected at the first position from the mask differently in comparison with an intensity of the light beam reflected at the second position from the mask via an optical element being arranged in the beam path and located a distance from any conjugate plane associated with the mask, the optical element including a plurality of regions having different degrees of reflection or transmission with each region being assigned to a respective one of the positions.

25. A method for projecting a pattern from a mask onto a substrate comprising:

emitting a light beam in the extreme ultraviolet wavelength range via a radiation source;

directing the light beam onto a mask via an illumination optical system including a collector mirror and forming a first part of a beam path, wherein the mask includes absorbent and reflective structure elements arranged to form the pattern;

patterning and reflecting the light beam from the mask;

focusing the reflected light beam on the substrate to image the pattern on the substrate via a projection optical system including an arrangement of reflective mirrors forming a second part of the beam path; and attenuating an intensity of the light beam reflected at a first position from the collector mirror differently in comparison with an intensity of the light beam reflected at a second position from the collector mirror via an optical element being arranged in the beam path and located a distance from any conjugate plane associated with the mask, the optical element including a plurality of regions having different degrees of reflection or transmission with each region being assigned to a respective one of the positions, wherein said attenuation compensates for a deviation of the degree of reflection at the different positions on the collector mirror to which the regions are respectively assigned and said deviation is caused by radiation removal.

26. The system of claim 1, wherein the optical element is disposed within the second part of the beam path so as to be situated between the mask and the substrate during system operation.

* * * * *